United States Patent
Park et al.

(10) Patent No.: US 8,367,465 B2
(45) Date of Patent: Feb. 5, 2013

(54) INTEGRATED CIRCUIT PACKAGE ON PACKAGE SYSTEM

(75) Inventors: DongSam Park, Ichon-si (KR); Choong Bin Yim, Seongnam-si (KR); In Sang Yoon, Ichon-si (KR)

(73) Assignee: STATS Chippac Ltd., Singapore (SG)

(*) Notice: Subject to any disclaimer, the term of this patent is extended or adjusted under 35 U.S.C. 154(b) by 537 days.

(21) Appl. No.: 11/276,942

(22) Filed: Mar. 17, 2006

(65) Prior Publication Data
US 2007/0216006 A1    Sep. 20, 2007

(51) Int. Cl.
*H01L 21/00*    (2006.01)
(52) U.S. Cl. . 438/107; 438/108; 438/109; 257/E21.499; 257/678; 257/686
(58) Field of Classification Search ............... 257/678, 257/686, E21.499; 438/107–109
See application file for complete search history.

(56) References Cited

U.S. PATENT DOCUMENTS

| | | | |
|---|---|---|---|
| 6,445,075 B1 | 9/2002 | Scanlan et al. | |
| 6,448,110 B1 | 9/2002 | Chen et al. | |
| 6,494,361 B1 | 12/2002 | Scanlan et al. | |
| 6,784,530 B2 * | 8/2004 | Sugaya et al. | 257/686 |
| 6,812,567 B2 | 11/2004 | Kim et al. | |
| 7,566,961 B2 * | 7/2009 | Cho | 257/686 |
| 2003/0197260 A1 * | 10/2003 | Nishimura et al. | 257/686 |
| 2004/0084771 A1 * | 5/2004 | Bolken et al. | 257/738 |
| 2005/0012195 A1 * | 1/2005 | Go et al. | 257/686 |
| 2005/0121764 A1 * | 6/2005 | Mallik et al. | 257/686 |
| 2005/0266610 A1 * | 12/2005 | Akram et al. | 438/107 |
| 2006/0108676 A1 * | 5/2006 | Punzalan et al. | 257/686 |
| 2008/0315399 A1 * | 12/2008 | Bauer et al. | 257/698 |

* cited by examiner

*Primary Examiner* — Eugene Lee
*Assistant Examiner* — Elias M Ullah
(74) *Attorney, Agent, or Firm* — Ishimaru & Associates LLP; Mikio Ishimaru

(57) ABSTRACT

A integrated circuit package on package system is provided including providing a base substrate having a base stackable connection, attaching a base integrated circuit on the base substrate, forming a stackable package including the base integrated circuit encapsulated with the base stackable connection partially exposed, and attaching a bottom package on the stackable package.

20 Claims, 5 Drawing Sheets

INTEGRATED CIRCUIT PACKAGE ON PACKAGE SYSTEM

TECHNICAL FIELD

The present invention relates generally to an integrated circuit package system, and more particularly to a system for an integrated circuit package on package.

BACKGROUND ART

Across all sectors, industries, and geographies, demands continue for the electronic industry to provide products that are lighter, faster, smaller, multi-functional, more reliable, and more cost-effective. In order to meet these expanding requirements of so many and varied consumers, more electrical circuits need to be more highly integrated to provide the functions demanded. Across virtually all applications, there continues to be growing demand for reducing size, increasing performance, and improving features of integrated circuits.

The seemingly endless restrictions and requirements are no more visible than with products in our daily lives. Smaller and denser integrated circuits are required in many portable electronic products, such as cell phones, portable computers, voice recorders, etc. as well as in many larger electronic systems, such as cars, planes, industrial control systems, etc. As the demand grows for smaller electronic products with more features, manufacturers are seeking ways to include more features as well as reduce the size of the integrated circuits. However, increasing the density of integration in integrated circuits may be expensive and have technical limitations. Though technology continues its growth to once unimagined extents, practical limits of individual integrated circuits do exist.

To meet these needs, three-dimensional type integrated circuit packaging techniques have been developed and used. Packaging technologies are increasingly using smaller form factors with more circuits in three-dimensional packages. In general, package stacks made by stacking packages and stacked chip packages made by stacking chips in a package have been used. Package stacks may be manufactured by stacking packages that have already passed the necessary tests for their functions. Therefore, the yields and reliability of these package stacks may be higher than those stacked chip packages manufactured by stacking chips without being tested. However, the package stacks may be thicker as compared with stacked chip packages, because of the thickness of each individual stacked package.

Stacked packages are also susceptible to warpage causing uneven or missing mounting features or electrical connections. Attempts to provide stacking features have met with difficult to control manufacturing, incompatible or incongruous materials, as well as insufficient structural integrity. The stacking features must provide both structural and electrical integrity and uniformity in order to provide reliable, high yield and functioning systems. In addition to providing the necessary structural and electrical integrity, the packages must provide an easy mounting process. The easy mounting process requires high yield for finished devices as well as known and economical manufacturing and equipment.

Thus, a need still remains for an integrated circuit package on package system to provide improved reliability, manufacturing yield and utility. In view of the present demands for improved cost structures and improved efficiencies, it is increasingly critical that answers be found to these problems.

Solutions to these problems have been long sought but prior developments have not taught or suggested any solutions and, thus, solutions to these problems have long eluded those skilled in the art.

DISCLOSURE OF THE INVENTION

The present invention provides a base substrate having a base stackable connection, attaching a base integrated circuit on the base substrate, forming a stackable package including the base integrated circuit encapsulated with the base stackable connection partially exposed, and attaching a bottom package on the stackable package.

Certain embodiments of the invention have other aspects in addition to or in place of those mentioned or obvious from the above. The aspects will become apparent to those skilled in the art from a reading of the following detailed description when taken with reference to the accompanying drawings.

BEST MODE FOR CARRYING OUT THE INVENTION

Figure 1:
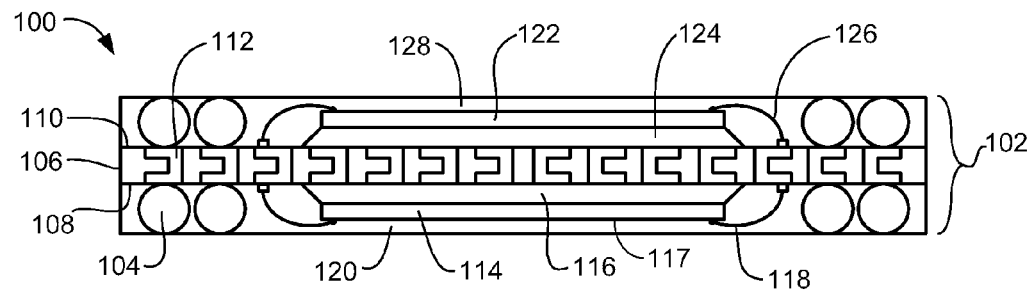
FIG. 1 is a cross-sectional view of a cross-sectional view of an integrated circuit package on package system in an embodiment of the present invention.

In the following description, numerous specific details are given to provide a thorough understanding of the invention. However, it will be apparent that the invention may be practiced without these specific details. In order to avoid obscuring the present invention, some well-known circuits, and process steps are not disclosed in detail.

Likewise, the drawings showing embodiments of the apparatus/device are semi-diagrammatic and not to scale and, particularly, some of the dimensions are for the clarity of presentation and are shown greatly exaggerated in the drawing FIGs. Similarly, although the sectional views in the drawings for ease of description show the invention with surfaces as oriented downward, this arrangement in the FIGs. is arbitrary and is not intended to suggest that invention should necessarily be in a downward direction. Generally, the device can be operated in any orientation. In addition, the same numbers are used in all the drawing FIGs. to relate to the same elements.

The term "horizontal" as used herein is defined as a plane parallel to the conventional plane or surface of the invention, regardless of its orientation. The term "vertical" refers to a direction perpendicular to the horizontal as just defined. Terms, such as "on", "above", "below", "bottom", "top", "side" (as in "sidewall"), "higher", "lower", "upper", "over", and "under", are defined with respect to the horizontal plane. The term "on" refers to direct contact among the elements.

The term "processing" as used herein includes deposition of material or photoresist, patterning, exposure, development, etching, cleaning, and/or removal of the material or photoresist as required in forming a described structure.

Referring now to FIG. 1, therein is shown a cross-sectional view of an integrated circuit package on package system 100 in an embodiment of the present invention. The integrated circuit package on package system 100 includes a stackable package 102 including stackable connections 104 such as solder-on-pad connections. The stackable connections 104 are attached on a base substrate 106 having a first base surface 108 and a second base surface 110. First electrical traces (not shown) on the first base surface 108 and second electrical traces (not shown) on the second base surface 110 can be connected through base connectors 112. The first electrical traces and the second electrical traces can connect the stackable connections 104 to components on either of the first base surface 108 or the second base surface 110.

A first base integrated circuit 114 is attached to the first base surface 108 with a first base mounting layer 116. A base connect side 117 of the first base integrated circuit 114 is electrically connected to and facing away from the first base surface 108 of the base substrate 106 by first electrical connectors 118, such as bond wires. The first base integrated circuit 114, the first electrical connectors 118, and the stackable connections 104 on the first base surface 108 of the base substrate 106 are encapsulated by a molding process with an encapsulant such as a first molding material 120. The first molding material 120 partially covers the stackable connections 104 providing the stackable connections 104 partially exposed. The stackable connections 104 are partially exposed to provide electrical interconnection when stacked with other packages or attached to a next level system such as a printed circuit board.

In a manner similar to the first base integrated circuit 114, a second base integrated circuit 122 is attached to the second base surface 110 with a second base mounting layer 124. The second base integrated circuit 122 is electrically connected to the base substrate 106 by second electrical connectors 126, such as bond wires. The second base integrated circuit 122, the second electrical connectors 126, and the stackable connections 104 on the second base surface 110 are encapsulated by a double-side molding process with an encapsulant such as a second molding material 128. The stackable package 102 includes the stackable connections 104 partially exposed on both the first base surface and the second base surface 110.

The stackable connections 104 are formed on the base substrate 106 adjacent to the first base integrated circuit 114 and the second base integrated circuit 122. The stackable connections 104 are also similar in height to the first base integrated circuit 114 with the first electrical connectors 118 and the second base integrated circuit 122 with the second electrical connectors 126. The first molding material 120 and the second molding material 128 are formed around the stackable connections 104, the first base integrated circuit 114 with the first electrical connectors 118 and the second base integrated circuit 122 with the second electrical connectors 126. The first molding material 120 and the second molding material 128 also cover the base substrate 106 providing structural integrity to the stackable package 102. It has been discovered that the stackable package 102 provides significant improvement in warpage and low profile.

Figure 2:
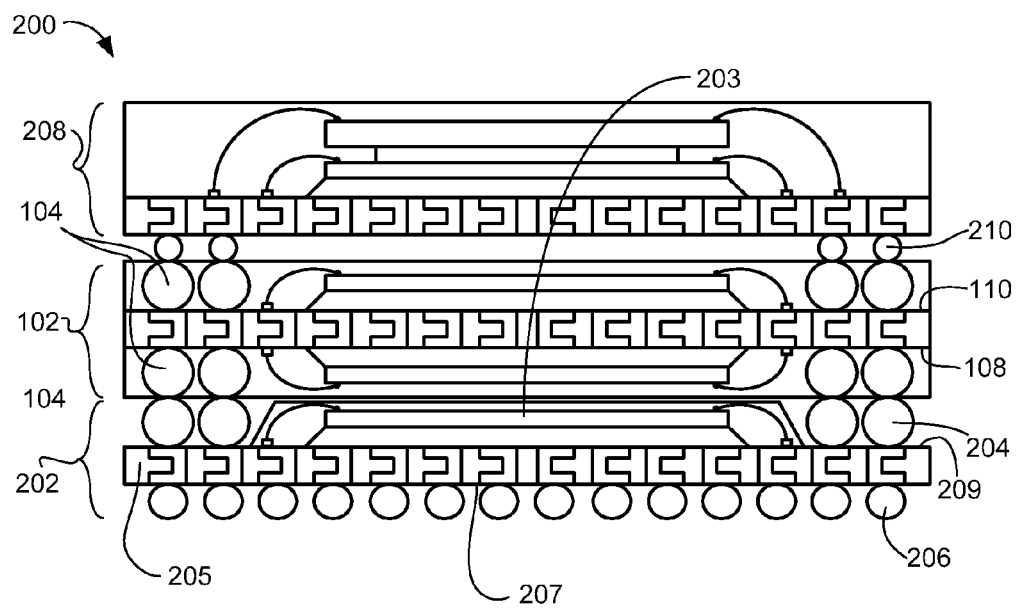
FIG. 2 is a cross-sectional view of an integrated circuit package on package system in an alternative embodiment of the present invention.

Referring now to FIG. 2, therein is shown a cross-sectional view of an integrated circuit package on package system 200 in an alternative embodiment of the present invention. The integrated circuit package on package system 200 includes the stackable package 102 of FIG. 1. Below the stackable package 102 is a bottom package 202 having an integrated circuit die 203, adjacent to first bottom connections 204, and second bottom connections 206. The first bottom connections 204 and the second bottom connections 206 are completely unencapsulated in any molding material. The bottom package 202 further includes a substrate such as a bottom package substrate 205 that is completely unencapsulated on a bottom surface 207 of the bottom package substrate 205. The bottom package substrate 205 can include a top surface 209 opposite and facing away from the bottom surface 207. The integrated circuit die 203 can be mounted on the top surface 209 with a die connect side of the integrated circuit die 203 facing away from and connected to the top surface 209 of the bottom package substrate 205. The first bottom connections 204 extend above the integrated circuit die 203 and are connected to, on, or in direct contact with the top surface and the stackable connections 104 on the first base surface 108 of the stackable package 102. The die connect side of the integrated circuit die 203 facing the base connect side 117 of the base integrated circuit 114 of the stackable package 102 and connected to the top surface 209. The second bottom connections 206 provide electrical connectivity to a next level system such as a printed circuit board. The integrated circuit package on package system 200 also includes a top package 208 having top connections 210. The top connections 210 are connected to the stackable connections 104 on the second base surface 110 of the stackable package 102.

The stackable package 102 provides stacking with other packages such as the top package 208 and the bottom package 202. The stackable connections 104 of the stackable package 102 facilitate stacking, including mounting and connecting, of two opposite sides of the stackable package 102. The stackable connections 104 of the first base surface 108 provide stacking on a bottom side and the stackable connections 104 of the second base surface 110 provide stacking on a top side. It has been discovered that the stackable package 102 including the stackable connections 104 provide significant improvement in stacking as well as low profile of the integrated circuit package on package system 200.

Figure 3:
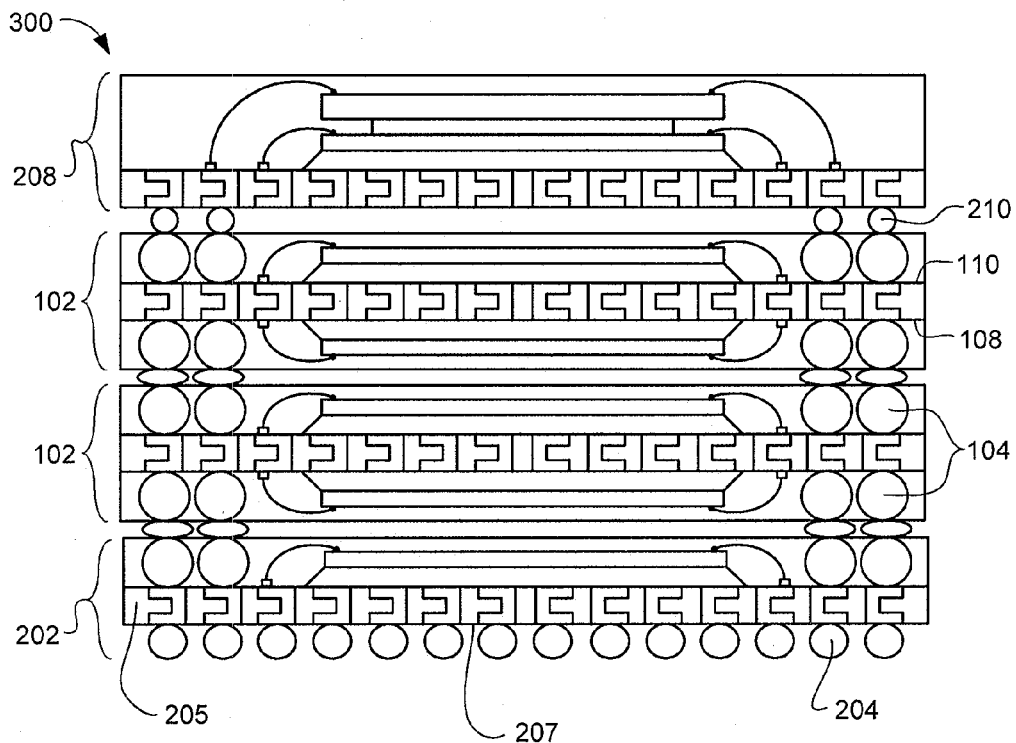
FIG. 3 is a cross-sectional view of an integrated circuit package on package system in an alternative embodiment of the present invention.

Referring now to FIG. 3, therein is shown a cross-sectional view of an integrated circuit package on package system 300 in an alternative embodiment of the present invention. The integrated circuit package on package system 300 includes two of the stackable package 102. The stackable package 102 is attached on another of the stackable package 102 to form a stack of the stackable package 102. Similar to the integrated circuit package on package system 200, the integrated circuit package on package system 300 also includes the top package 208 and the bottom package 202.

In a manner similar to the integrated circuit package on package system 200, the top connections 210 of the top package 208 are connected to the stackable connections 104 on the second base surface 110 of the stackable package 102 on the top of the stack of the stackable package 102. Also in a manner similar to the integrated circuit package on package system 200, the bottom package 202 includes the first bottom connections 204 of the bottom package 202 are connected to the stackable connections 104 on the first base surface 108 of the stackable package 102 on the bottom of the stack of the stackable package 102 and are completely unencapsulated. The bottom package 202 further has the substrate such as the bottom package substrate 205 with a completely unencapsulated bottom surface 207.

For illustrative purposes, two of the stackable packages 102 are shown although it is understood that any number of the stackable package 102 may be used. Further, for illustrative purposes, the stackable package 102 is shown one over another although it is understood that they may be configured differently. It has been discovered that the stackable package 102 including the stackable connections 104 provide significant improvement in stacking as well as low profile of the integrated circuit package on package system 300.

Figure 4:
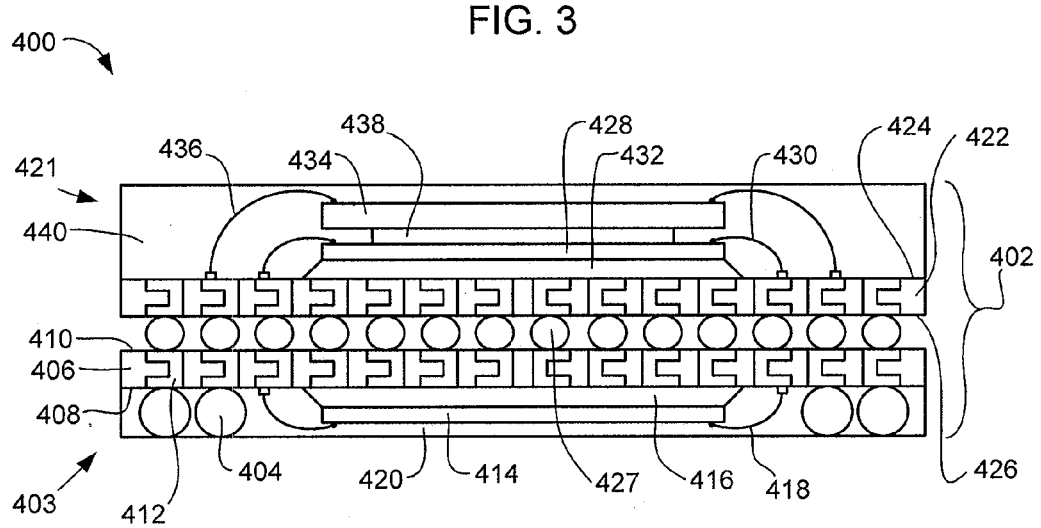
FIG. 4 is a cross-sectional view of an integrated circuit package on package system in an alternative embodiment of the present invention.

Referring now to FIG. 4, therein is shown a cross-sectional view of an integrated circuit package on package system 400 in an alternative embodiment of the present invention. The integrated circuit package on package system 400 includes a stackable package 402 that includes a first stackable package 403 and includes stackable connections 404 such as solder-on-pad connections. The stackable connections 404 are attached on a base substrate 406 having a first base surface 408 and a second base surface 410. First electrical traces (not shown) on the first base surface 408 and second electrical traces (not shown) on the second base surface 410 can be connected through base connectors 412. The first electrical traces and the second electrical traces can connect the stackable connections 404 to components on either of the first base surface 408 or the second base surface 410.

A base integrated circuit 414 is attached to the first base surface 408 with a base mounting layer 416. The base integrated circuit 414 is electrically connected to the base substrate 406 by base electrical connectors 418, such as bond wires. The base integrated circuit 414, the base electrical connectors 418, and the stackable connections 404 on the first base surface 408 are encapsulated by a single-side molding process with an encapsulant such as a base molding material 420. The base molding material 420 partially covers the stackable connections 404 providing the stackable connections 404 partially exposed. The stackable connections 404 are partially exposed to provide electrical interconnection when stacked with other packages or attached to a next level system such as a printed circuit board.

The stackable connections 404 are formed on the base substrate 406 adjacent to the base integrated circuit 414. The stackable connections 404 are also similar in height to the base integrated circuit 414 with the base electrical connectors 418. The base molding material 420 is formed around the stackable connections 404 and the base integrated circuit 414 with the base electrical connectors 418. The base molding material 420 also covers the base substrate 406 providing structural integrity to the stackable package 402.

The stackable package 402 also includes a bottom package 421 having a second substrate 422 having a mounting surface 424 and a bottom surface such as an interconnect surface 426 that is completely unencapsulated. Further, the bottom package 421 is connected to the base connectors 412 of with completely unencapsulated connections 427. A first top integrated circuit 428 is connected to the mounting surface 424 with first top electrical connectors 430, such as bond wires. The first top integrated circuit 428 is also mounted to the mounting surface 424 with a first top mounting layer 432. A second top integrated circuit 434 is also connected to the mounting surface 424 with second top electrical connectors 436, such as bond wires. The second top integrated circuit 434 is mounted to the first top integrated circuit 428 with a second top mounting layer 438.

The first top integrated circuit 428, the first top electrical connectors 430, the second top integrated circuit 434, and the second top electrical connectors 436 are encapsulated by a single-side molding process with an encapsulant such as a second molding material 440 that may optionally be the same as the base molding material 420. The second molding material 440 also covers the second substrate 422 providing structural integrity to the stackable package 402. It has been discovered that the stackable package 402 provides significant improvement in warpage and low profile.

Figure 5:
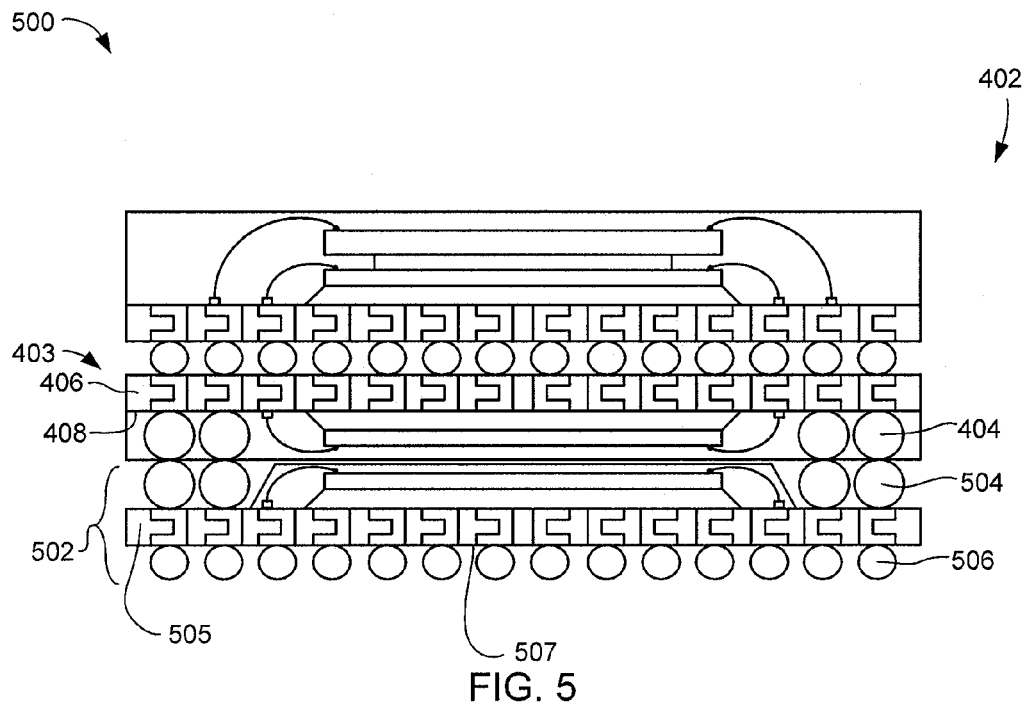
FIG. 5 is a cross-sectional view of an integrated circuit package on package system in an alternative embodiment of the present invention.

Referring now to FIG. 5, therein is shown a cross-sectional view of an integrated circuit package on package system 500 in an alternative embodiment of the present invention. The integrated circuit package on package system 500 includes the stackable package 403 of FIG. 4 and a bottom package 502 having first bottom connections 504 and second bottom connections 506, both of which are completely unencapsulated in any molding material. The bottom package 502 further includes a substrate such as a bottom package substrate 505 that is completely unencapsulated on a bottom surface 507 of the second package substrate 505. The first bottom connections 504 are connected to the stackable connections 404 on the first base surface 408 of the stackable package 402. The second bottom connections 506 provide electrical connectivity to a next level system such as a printed circuit board.

The stackable package 402 provides stacking with other packages such as the bottom package 502. The stackable connections 404 of the stackable package 402 facilitate stacking, including mounting and connecting, of the stackable package 402. The stackable connections 404 of the first base surface 408 of the base substrate 406 provide stacking on a bottom side. It has been discovered that the stackable package 402 including the stackable connections 404 provide improvement in stacking as well as low profile of the integrated circuit package on package system 500.

Figure 6:
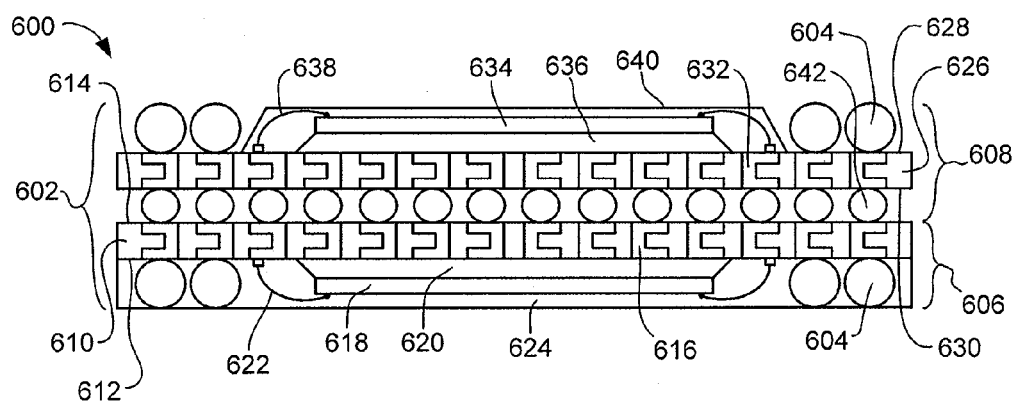
FIG. 6 is a cross-sectional view of an integrated circuit package on package system in an alternative embodiment of the present invention.

Referring now to FIG. 6, therein is shown a cross-sectional view of an integrated circuit package on package system 600 in an alternative embodiment of the present invention. The integrated circuit package on package system 600 includes a stackable package 602 including stackable connections 604 such as solder-on-pad connections. The stackable connections 604 are attached to a base package 606 and a core package 608. The base package 606 includes a base substrate 610 having a first base surface 612 and a second base surface 614. First base electrical traces (not shown) on the first base surface 612 and second base electrical traces (not shown) on the second base surface 614 can be connected through base connectors 616. The first base electrical traces and the second base electrical traces can connect the stackable connections 604 to components on either of the first base surface 612 or the second base surface 614.

A base integrated circuit 618 is attached to the first base surface 612 with a base mounting layer 620. The base integrated circuit 618 is electrically connected to the base substrate 610 by base electrical connectors 622, such as bond wires. The base integrated circuit 618, the base electrical connectors 622, and the stackable connections 604 on the first base surface 612 are encapsulated by a single-side molding process with an encapsulant such as a base molding material 624. The base molding material 624 partially covers the stackable connections 604 providing the stackable connections 604 partially exposed. The stackable connections 604 are partially exposed to provide electrical interconnection when stacked with other packages or attached to a next level system such as a printed circuit board.

The integrated circuit package on package system 600 also includes the core package 608 including a substrate such as a core substrate 626 having a first core surface 628 and a bottom surface such as a second core surface 630, the second core surface 630 is completely unencapsulated. First core electrical traces (not shown) on the first core surface 628 and second core electrical traces (not shown) on the second core surface 630 can be connected through core connectors 632. The first core electrical traces and the second core electrical traces can connect the stackable connections 604 to components on either of the first core surface 628 or the second core surface 630. Further bottom connections 642 connect the core package 608 to the base connectors 616 of the base package 606 and are completely unencapsulated.

A core integrated circuit 634, such as a wire-bond integrated circuit die is attached to the first core surface 628 with a core mounting layer 636. The core integrated circuit 634 is electrically connected to the core substrate 626 by core electrical connectors 638, such as bond wires. The core integrated circuit 634 and the core electrical connectors 638 are encapsulated by a single-side molding process with an encapsulant such as a core molding material 640. The core molding material 640 provides the stackable connections 604 exposed. The stackable connections 604 are exposed to provide electrical interconnection when stacked with other packages or attached to a next level system such as a printed circuit board.

The stackable connections 604 are formed on the base substrate 610 adjacent to the base integrated circuit 618 and on the core substrate 626 adjacent to the core integrated circuit 634. The stackable connections 604 are also similar in height to the base integrated circuit 618 with the base electrical connectors 622 and the core integrated circuit 634 with the core electrical connectors 638.

The base molding material 624 is formed around the stackable connections 604 and the base integrated circuit 618 with the base electrical connectors 622. The core molding material 640 is formed around the core integrated circuit 634 with the core electrical connectors 638. The base molding material 624 and the core molding material 640 also cover the base substrate 610 and the core substrate 626, providing structural integrity to the base package 606, the core package 608, and the stackable package 602. It has been discovered that the stackable package 602 provides significant improvement in warpage and low profile.

Figure 7:
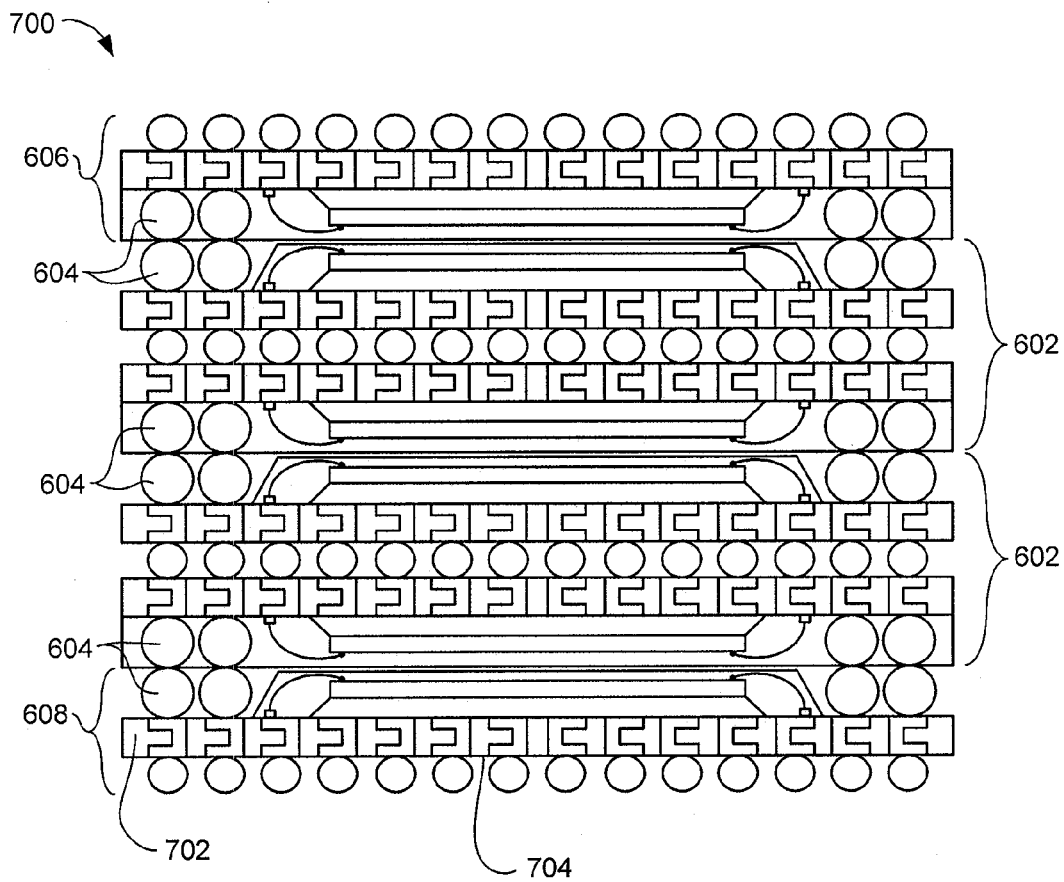
FIG. 7 is a cross-sectional view of an integrated circuit package on package system in an alternative embodiment of the present invention.

Referring now to FIG. 7, therein is shown a cross-sectional view of an integrated circuit package on package system 700 in an alternative embodiment of the present invention. The integrated circuit package on package system 700 includes two of the stackable package 602. The stackable package 602 is attached below another of the stackable package 602 to form a stack of the stackable package 602. The integrated circuit package on package system 700 also includes the bottom package such as the core package 608 and the base package 606. The stackable connections 604 of the base package 606 are connected to the stackable connections 604 on the core package 608 on the top of the stack of the stackable package 602. The bottom connections such as the stackable connections 604 of the core package 608 are completely unencapsulated and are connected to the stackable connections 604 on the base package 606 on the bottom of the stack of the stackable package 602. The core package 608 further has a substrate 702 having a bottom surface 704 that is completely unencapsulated.

For illustrative purposes, two of the stackable packages 602 are shown although it is understood that any number of the stackable package 602 may be used. Further, for illustrative purposes, the stackable package 602 is shown one over another although it is understood that they may be configured differently. It has been discovered that the stackable package 602 including the stackable connections 604 provide significant improvement in stacking as well as low profile of the integrated circuit package on package system 700.

Figure 8:
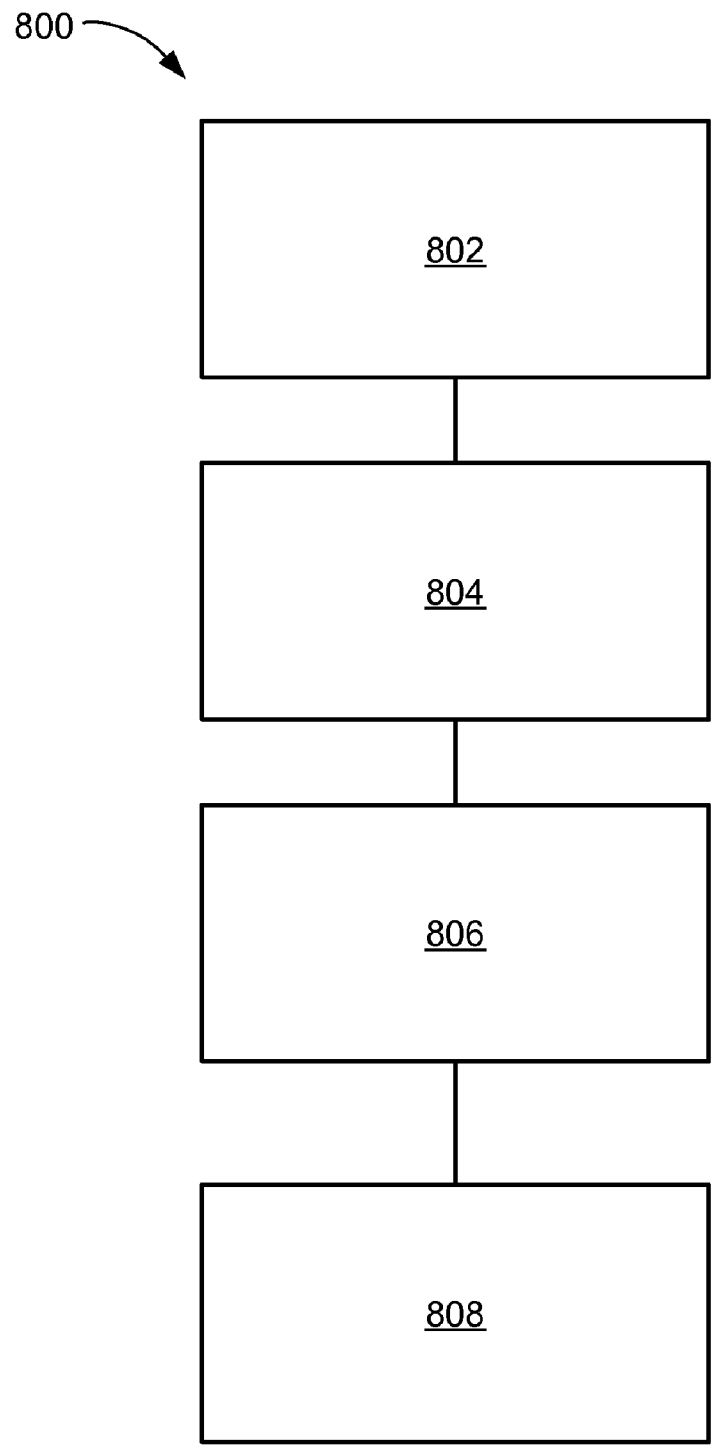
FIG. 8 is a flow chart of an integrated circuit package on package system for manufacturing the integrated circuit package on package system in an embodiment of the present invention.

Referring now to FIG. 8, therein is shown a flow chart of an integrated circuit package on package system 800 for manufacturing the integrated circuit package on package system 100 in an embodiment of the present invention. The system 800 includes providing a base substrate having a base stackable connection in a block 802; attaching a base integrated circuit on the base substrate in a block 804; forming a stackable package including the base integrated circuit encapsulated with the base stackable connection partially exposed in a block 806; and attaching a bottom package on the stackable package in a block 808.

In greater detail, a method to fabricate the integrated circuit package on package system 100, in an embodiment of the present invention, is performed as follows:

1. Forming a base substrate having a base stackable connection and a base substrate connector. (FIG. 1)
2. Attaching a base electrical connector between a base integrated circuit and the base substrate. (FIG. 1)
3. Molding an encapsulant over the base integrated circuit with the base stackable connection partially exposed to form a stackable package. (FIG. 1)
4. Mounting a bottom package on the base stackable connection of the stackable package. (FIG. 1)

It has been discovered that the present invention thus has numerous aspects.

An aspect is that the present invention provides the stackable package. The stackable package provides a multi-stack through the single or the double-side molding structure of alternative embodiments of the stackable package. The stackable package is molded on either one side or both sides and can be stacked with electrical connectivity maintained through encapsulation with the epoxy mold compound.

Another aspect is that the present invention provides the stackable connections such as solder-on-pad connections. The stackable connections are exposed after the package is entirely molded on one or both sides with the epoxy mold compound. The multi-stack interconnectivity is provided by the stackable connections between some or all the stackable packages, the top package, and the bottom package.

Yet another aspect of the present invention is compatibility with single and double-side molding. The stackable package can be formed by molding the first side of the base substrate and the second side of the base substrate using double-side molding. Alternatively, the stackable package can be formed by single-side molding of the base substrate and connecting the base substrate to the second substrate also having a single-side molding.

It has been discovered that the disclosed structure provides a low profile. The stackable connections are formed on the side of the base substrate having the integrated circuit die. Limited or no additional height is required for the stackable connections in the stackable package. The use of height already required by the integrated circuit provides a very low profile for the stackable package.

It has also been discovered that the disclosed structure provides reduced warpage of the stackable package. The stackable package is encapsulated surrounding the stackable connections on the base substrate. The structure of the stackable package provides the stackable connections exposed externally after being entirely molded on one or both sides with epoxy mold compound. This structure provides a multi stack package without warpage.

Yet another discovery of the disclosed structure is easy package mounting. The elimination of warpage allows the stackable connections of the stackable package to be substantially coplanar. The exposed portions of the stackable connections provide a substantially uniform mounting surface for other packages. The other packages can be easily attached to a uniform mounting surface such as that provided by the stackable package.

Yet another discovery of the disclosed structure is stacking of the stackable package on another of the stackable package in some of the embodiments. While the stackable connections provide a substantially uniform mounting surface for other packages, the mounting surface is particularly compatible with another of the stackable package. Any number of the stackable package can be stacked on another of the stackable package.

These and other valuable aspects of the present invention consequently further the state of the technology to at least the next level.

Thus, it has been discovered that the integrated circuit package on package system method and apparatus of the present invention furnish important and heretofore unknown and unavailable solutions, capabilities, and functional aspects. The resulting processes and configurations are straightforward, cost-effective, uncomplicated, highly versatile, and effective, can be implemented by adapting known technologies, and are thus readily suited for efficient and economical manufacturing.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations, which fall within the scope of the included claims. All matters hithertofore set forth herein or shown in the accompanying drawings are to be interpreted in an illustrative and non-limiting sense.

The invention claimed is:

1. A method of manufacture of an integrated circuit package on package system comprising:
    providing a base substrate having a stackable connection;
    attaching a base integrated circuit on the base substrate, a base connect side of the base integrated circuit facing away from and connected to the base substrate;
    forming a stackable package including the base integrated circuit encapsulated with the stackable connection partially exposed; and
    attaching a bottom package on the stackable package, the bottom package having:
        a substrate with a top surface,
        an integrated circuit die mounted on the top surface of the substrate, a die connect side of the integrated circuit die connected to the top surface and facing the base connect side of the base integrated circuit of the stackable package, and
        a completely unencapsulated bottom connection, extending above the integrated circuit die, in direct contact with the top surface and the stackable connection of the stackable package.

2. The method as claimed in claim 1 further comprising attaching the stackable package on another of the stackable package.

3. The method as claimed in claim 1 wherein forming the stackable package includes:
    attaching a second integrated circuit on a side opposite the base integrated circuit of the base substrate; and
    applying an encapsulant over the second integrated circuit with the stackable connection partially exposed.

4. The method as claimed in claim 1 wherein forming the stackable package includes:
    providing a second substrate having a second stackable connection;
    attaching a second integrated circuit on the second substrate;
    applying a second encapsulant over the second integrated circuit having the second stackable connection partially exposed; and
    attaching the second substrate over the base substrate with the stackable connection and the second stackable connection partially exposed.

5. The method as claimed in claim 1 wherein forming the stackable package includes:
    providing a second substrate;
    attaching a second integrated circuit and a third integrated circuit over the second substrate; and
    connecting the second substrate over the base substrate with the stackable connection partially exposed.

6. A method of manufacture of an integrated circuit package on package system comprising:
    forming a base substrate having a stackable connection;
    attaching an electrical connector to a base connect side of a base integrated circuit and the base substrate, the base connect side of the base integrated circuit facing away from the base substrate;
    applying an encapsulant over the base integrated circuit with the stackable connection partially exposed to form a stackable package; and
    mounting a bottom package on the stackable package, the bottom package having:
        a substrate with a top surface,
        an integrated circuit die mounted on the top surface of the substrate, a die connect side of the integrated circuit die connected to the top surface and facing the base connect side of the base integrated circuit of the stackable package, and
        a completely unencapsulated bottom connection, extending above the integrated circuit die, in direct contact with the top surface and the stackable connection of the stackable package.

7. The method as claimed in claim 6 wherein applying the encapsulant includes applying a single-side molding.

8. The method as claimed in claim 6 wherein applying the encapsulant includes applying a double-side molding.

9. The method as claimed in claim 6 further comprising attaching the stackable connection of the stackable package on another of the stackable connection of another of the stackable package.

10. The method as claimed in claim 6 further comprising mounting a top package on the stackable connection of the stackable package.

11. An integrated circuit package on package system comprising:
    a base substrate having a stackable connection;
    a base integrated circuit on the base substrate with a base connect side of the base substrate facing away from and connected to the base substrate;
    a stackable package including the base integrated circuit encapsulated with the stackable connection partially exposed; and
    a bottom package on the stackable package, the bottom package having:

a substrate with a top surface, an integrated circuit die mounted on the top surface of the substrate, a die connect side of the integrated circuit die connected to the top surface and facing the base connect side of the base integrated circuit of the stackable package, and a completely unencapsulated bottom connection extends above the integrated circuit die and is in direct contact with the top surface and the stackable connection of the stackable package.

12. The system as claimed in claim 11 further comprising the stackable package on another of the stackable package.

13. The system as claimed in claim 11 wherein the stackable package includes:

a second integrated circuit on a side opposite the base integrated circuit of the base substrate; and the encapsulant over the second integrated circuit with the stackable connection partially exposed.

14. The system as claimed in claim 11 wherein the stackable package includes:

a second substrate having a second stackable connection;

a second integrated circuit on the second substrate;

a second encapsulant over the second integrated circuit having the second stackable connection partially exposed; and the second substrate over the base substrate with the stackable connection and the second stackable connection partially exposed.

15. The system as claimed in claim 11 wherein the stackable package includes:

a second substrate;

a second integrated circuit and a third integrated circuit over the second substrate; and the second substrate over the base substrate with the stackable connection partially exposed.

16. The system as claimed in claim 11 wherein:

the base integrated circuit includes an electrical connector attached to a base connect side of the base integrated circuit and the base substrate; and the stackable package includes an encapsulant over the base integrated circuit with the stackable connection partially exposed.

17. The system as claimed in claim 16 wherein the encapsulant includes a single-side molding.

18. The system as claimed in claim 16 wherein the encapsulant includes a double-side molding.

19. The system as claimed in claim 16 further comprising the stackable connection of the stackable package on another of the stackable connection of another of the stackable package.

20. The system as claimed in claim 16 further comprising a top package on the stackable connection of the stackable package.

* * * * *